United States Patent [19]
Ozeki et al.

[11] Patent Number: 5,717,366
[45] Date of Patent: Feb. 10, 1998

[54] LADDER TYPE PIEZOELECTRIC FILTER INCLUDING CONDUCTIVE RUBBER PLATES

[75] Inventors: Eiji Ozeki; Kenji Kawakami, both of Nagoya, Japan

[73] Assignee: NGK Spark Plug Co., Ltd., Aichi-Ken, Japan

[21] Appl. No.: 792,225

[22] Filed: Jan. 31, 1997

Related U.S. Application Data

[63] Continuation of Ser. No. 592,444, Jan. 26, 1996, abandoned, which is a continuation of Ser. No. 422,767, Apr. 14, 1995, abandoned, which is a continuation of Ser. No. 46,793, Apr. 16, 1993, abandoned.

[30] Foreign Application Priority Data

Apr. 24, 1992 [JP] Japan .................. 4-034472 U

[51] Int. Cl.$^6$ .................................................. H03H 9/00
[52] U.S. Cl. ........................ 333/189; 333/188; 310/348
[58] Field of Search ............................. 333/189, 191, 333/190, 187, 188, 192; 310/348, 363

[56] References Cited

U.S. PATENT DOCUMENTS

| | | | |
|---|---|---|---|
| 3,560,772 | 2/1971 | Lungo et al. | 310/369 |
| 4,308,482 | 12/1981 | Kadohashi | 310/354 |
| 4,360,754 | 11/1982 | Toyoshima et al. | 310/366 |
| 4,398,162 | 8/1983 | Nagai . | |
| 4,492,892 | 1/1985 | Nakutani | 310/345 |
| 4,896,069 | 1/1990 | Rosenberg et al. | 310/339 |
| 5,057,802 | 10/1991 | Ozeki et al. | 333/189 |
| 5,130,680 | 7/1992 | Nagai et al. | 333/189 |

FOREIGN PATENT DOCUMENTS 0004314  1/1986  Japan .

OTHER PUBLICATIONS

"High Impedance Piezoelectric Ceramic Resonators and Thier Application to Ladder Filters" *Electronics and Communications in Japan* by Hiromichi Jumonji, vol. 33-A No. 8 1970, pp. 17-23.

*Primary Examiner*—Robert Pascal
*Assistant Examiner*—Darius Gambino
*Attorney, Agent, or Firm*—Larson & Taylor

[57] ABSTRACT

A ladder-type electric filter device having rubber plates each provided on one or both sides of each of the piezoelectric resonators so as to be brought into resilient contact with the surface of the associated piezoelectric resonator. The rubber plates are shaped so as to not be brought into contact with the respective corner edges of the respective piezoelectric resonators which generate extensive contour vibrations. Thus, the contour vibrations are not suppressed, the insertion loss can be reduced, and a mechanical quality factor Q can be substantially decreased, thereby improving group delay frequency characteristics.

7 Claims, 5 Drawing Sheets

LADDER TYPE PIEZOELECTRIC FILTER INCLUDING CONDUCTIVE RUBBER PLATES

This application is a continuation of application Ser. No. 08/592,444 filed Jan. 26, 1996 now abandoned, which is a continuation of Ser. No. 08/422,767, filed Apr. 14, 1995, now abandoned, which is a continuation of Ser. No. 08/046,793, filed on Apr. 16, 1993, now abandoned.

BACKGROUND OF THE INVENTION

The present invention relates to a ladder-type electric filter device for a filter circuit in a portable and mobile radio communication unit such as an automobile telephone set.

Generally, such a filter circuit is normally constructed by successively connecting a plurality of electric filter units each of which includes: one or more series piezoelectric resonator elements, one or more parallel piezoelectric resonator elements, terminal plates each having a connecting leg, and a casing for containing the resonator elements and the terminal plates.

With a view to making such a filter device smaller and thinner, it has been attempted to possibly decrease the height of the filter arrangement by containing only one or a few essential filter units within one casing. With the electric filter device of this type, each filter unit is mounted on a printed circuit board, connecting terminal legs of the terminal plates extended from the casing are bent toward the printed circuit board and are connected to predetermined conductive lines provided on the board.

Recently, the radio communication units of the above mentioned type are required to have a vibration proofing, a shock resistance and a good group delay characteristic. In order to meet such a requirment, it has been proposed that rectangular insulating rubber plates of silicone rubber or the like are interposed between each series piezoelectric resonator element and the respective terminal plates disposed on both the sides of the piezo-electric resonator element for sandwiching it and between each parallel piezoelectric resonator element and the respective terminal plate disposed on both the sides of the parallel piezoelectric resonator element for sandwiching it, respectively, and the rectangular rubber plates are brought into resilient contact with the surfaces of the respective piezoelectric resonator elements. The electrical connection between each piezoelectric resonator element and the associated terminal plates is performed by bringing the electrodes of each piezoelectric resonator element into contact with a protuberance formed on each terminal plate through a center opening provided on the associated insulating rubber plate for passing the protuberance of the terminal plate. An example of such filter arrangements is disclosed in U.S. Pat. No. 4,398,162.

With the filter arrangement of this kind, since the insulating rubber plate is interposed between each resonator element and each terminal plate as a spacer the resonator elements neither get tilted nor have their supporting points dislocated even when subjected to an external vibration or impact, thereby ensuring that the resonator elements can always be stably supported. Further, the resilient contact of the rubber plates with the surfaces of the respective resonator elements results in that the resonators have an increased resonance resistance and thus a substantially decreased mechanical quality factor Q, thereby improving group delay frequency characteristics.

However, if the rubber plates interposed between the resonator element and the associated terminal plates are too thick, there is the possibility of the contact point of the protuberance of each terminal plate being apart from the resonator element so that a bad conducting therebetween may occur. In the prior art, therefore, it was necessary to strictly control the dimensions of the rubber plates.

In order to ensure the connection between the contact point of each terminal plate and resonator element so as to avoid such bad conducting therebetween, instead of the rectangular insulating rubber plates the use of rectangular conducting rubber plates of conducting silicone rubber or the like has been proposed. However, the conducting rubber plates come into contact with the parallel resonator elements so that the thickness of the conductive layers including electrodes is increased and electrostatic capacitance is decreased. The ratio of the electrostatic capacitance of the parallel resonator elements to that of the series resonator elements is apparently decreased greater than a natural attenuation level thereof. An attempt to overcome this problem has been made by using a conducting rubber plate as a resilient plate to be interposed between each of the series resonator elements and the associated terminal plate, and an insulating rubber plate as a resilient plate to be interposed between each of the parallel resonator elements and the associated terminal plate.

In this way, it is known in prior art that the rubber plate to be interposed between each resonator element and each terminal plate is made of insulating material, the protuberance formed on the terminal plate is inserted into an opening provided in the center portion of the rubber plate so as to bring the protuberance into contact with an electrode of each resonator element, that a conducting rubber plate is used for ensuring an electrical connection therebetween, that a conducting rubber plate is provided with an opening through which a protuberance formed on a terminal plate is electrically connected with an electrode on each resonator element, that the electrical connection is performed by a rubber plate having no opening, and that a conducting rubber plate comes resiliently into contact with each series resonator element and an insulating rubber plate comes resiliently into contact with each parallel resonator element.

In the filter arrangements proposed in prior art as illustrated in FIG. 1, each resonator element generates a contour vibration in which a rectangular surface is deformed or vibrated to alternately show a rhomb shape as shown by a dotted line A and a chain line B. Consequently, each corner portion of the rectangular surface is extensively resonated. However, since each of the rubber plates is rectangular and has corner portions tightly contacted with the resonator elements, the vibration of each corner portion of each resonator element is suppressed, thereby making an insertion loss worse.

SUMMARY OF THE INVENTION

It is therefore an object of the present invention to provide a ladder-type electric filter device capable of overcoming the problems or disadvantages of the conventional filter arrangements, and having a good group delay characteristic and a small insertion loss.

According to the present invention, there is provided a ladder-type electric filter device comprising at least one piezoelectric resonator for a series branch and at least one piezoelectric resonator for a parallel branch, a plurality of terminal plates each having a connecting leg for electrically connecting said piezoelectric resonators to form a predetermined connection type filter circuit and mechanically supporting said piezoelectric resonators, and a casing for containing said piezoelectric resonators and said terminal plates, characterized in that a rubber plate is interposed between one or both surfaces of each piezoelectric resonator and the opposite terminal plate, each of the rubber plates has a contour with cut corners opposite to the corner edges of the associated piezoelectric resonator, and each rubber plate is brought into resilient contact with the associated piezoelectric resonator.

Each rubber plate may be circular shape, or polygonal such as octagon with each corner edge being cut opposite to the corner edges of the associated piezoelectric resonator.

Electrical connection between each of the piezoelectric resonators and the associated terminal plate may be performed by bringing a protuberance of the terminal plate into contact with an electrode of the piezoelectric resonator through an opening formed on the rubber plate.

Alternatively, the electrical connection between each of the resonators and the associated terminal plate may be performed by using a conducting rubber plate. In the filter device according to the present invention, the respective corner portions of each resonator, which are most extensively vibrated by the contour vibration thereof, are not in contact with the rubber plate, and thus the contour vibration is not substantially suppressed and the insertion loss is reduced.

The present invention will now be described by way of example with reference to the accompanying drawings:

DETAILED DESCRIPTION

Figure 1:
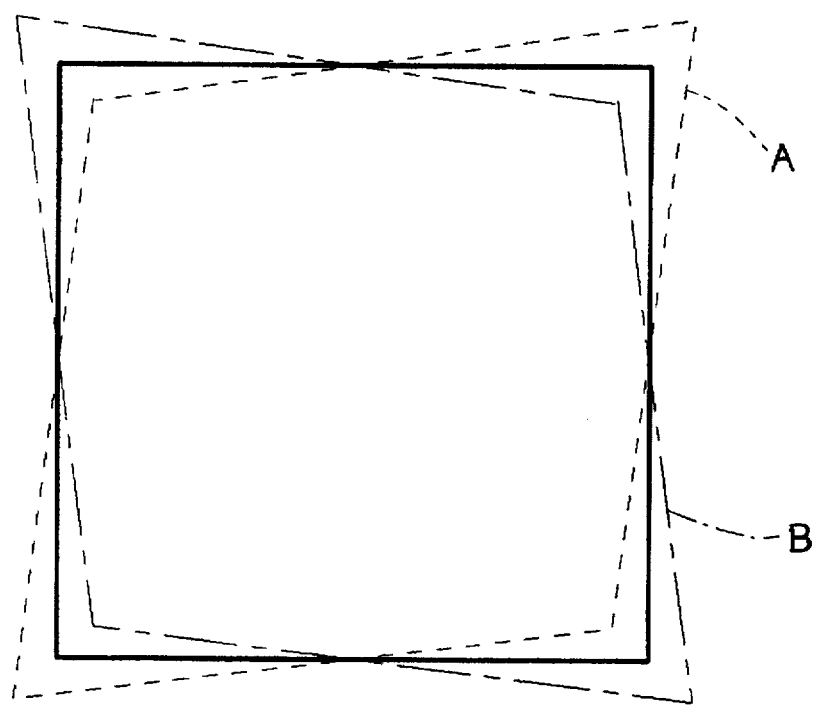
FIG. 1 is an explanation view showing a contour vibration of a piezoelectric resonator.

Referring to FIGS. 2 to 7, there is shown a ladder-type electric filter unit according to an embodiment of the present invention, which includes two essential unit circuits.

The reference numeral 1 represents a box-shape thin casing of an insulating material which has an opening 2 at a front side portion and an inner space 3. The casing 1 is is provided with an earth terminal plate 4 which may be integrally assembled into the inner space 3 by an insert molding. The earth terminal plate 4 has a connecting leg 4t which protrudes outward through the rear wall portion of the casing 1.

Within the inner space 3 of the casing 1 there is disposed a filter assembly having a plurality of elements for forming a filter circuit arrangement in a following manner.

Figure 2:
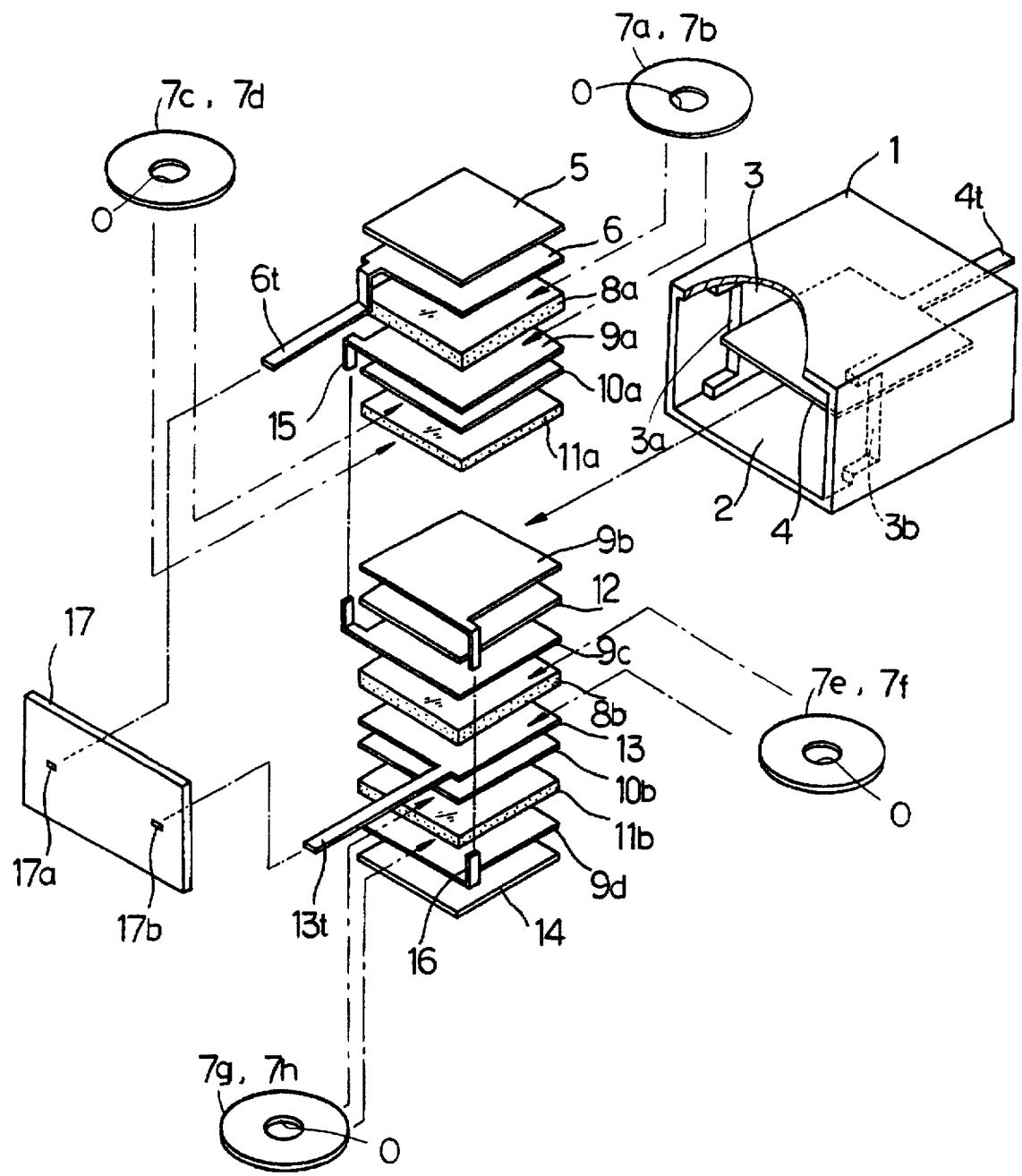
FIG. 2 is an exploded perspective view of one filter unit of an electric filter device according to the present invention.

As shown in FIG. 2, a first cushioning plate 5, an input terminal plate 6 provided with a connecting leg 6t extending from its front edge, a first annular conducting rubber plate 7a, a first thick series piezoelectric resonator 8a, a second annular conducting rubber plate 7b, a first junction terminal plate 9a, a first auxiliary terminal plate 10a, a third annular conducting rubber plate 7c, a first thin parallel piezoelectric resonator 11a and a fourth annular conducting rubber plate 7d are successively inserted through the opening 2 into the upper space portion defined between the top wall portion of the casing 1 and the earth terminal plate 4.

Also, within the lower space portion defined between the bottom wall portion of the casing 1 and the earth terminal plate 4 there are successively disposed a second junction terminal plate 9b, an insulating plate 12, a third junction terminal plate 9c, a fifth annular conducting rubber plate 7e, a second thick series piezoelectric resonator 8b, a sixth annular conducting rubber plate 7f, an output terminal plate 13 provided with a connecting leg 13t extending from its front edge, a second auxiliary terminal plate 10b, a seventh annular conducting rubber plate 7g, a second thin parallel piezoelectric resonator 11b, a eighth annular conducting rubber plate 7h, a fourth junction terminal plate 9d and a second cushioning plate 14.

The first junction terminal plate 9a is connected with the third junction terminal plates 9c via a connecting strip 15. Similarly, the second junction terminal plate 9b is connected with the fourth junction terminal plates 9d via a connecting strip 16. The connecting strips 15 and 16 are positioned within recesses 3a and 3b which are respectively provided on the side wall portions of the casing 1 near the opening 2 for preventing these connecting strips from contacting with the other elements.

Each of the annular conducting rubber plates 7a–7h may be made of conducting silicone rubber or the other suitable conducting rubber material.

When being assembled each annular conducting rubber plate interposed on both sides of each resonator is brought into resilient contact with the resonator.

Figure 3:
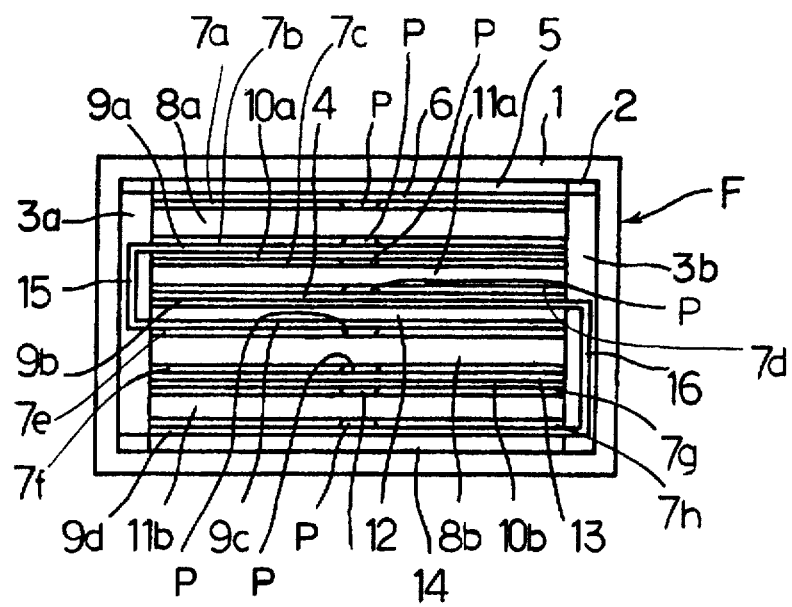
FIG. 3 is a schematic front view showing the electric filter unit when being mounted on the casing.
Figure 5:
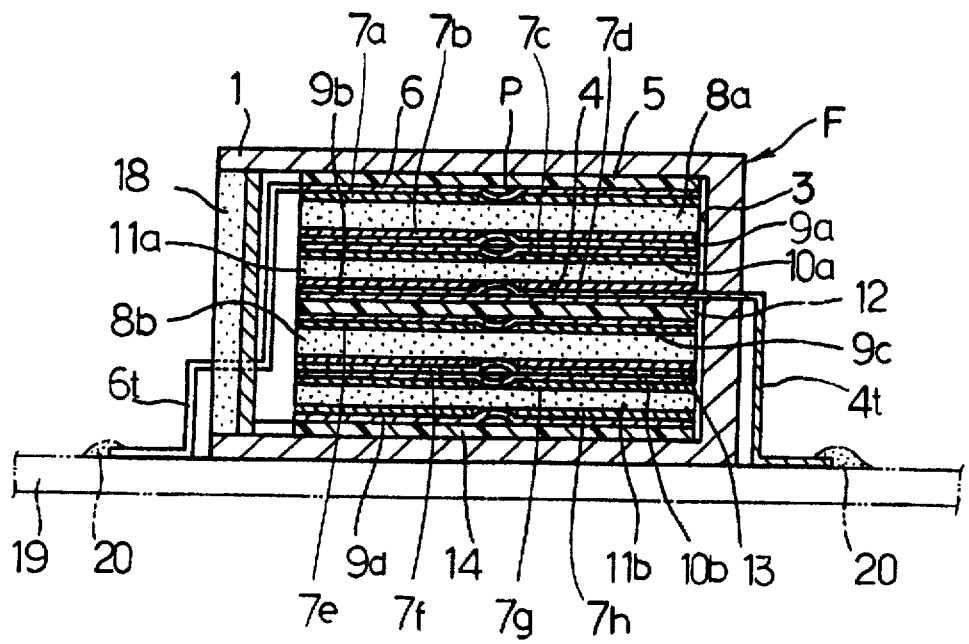
FIG. 5 is a schematic longitudinal section showing the assembled electric filter unit.
Figure 6:
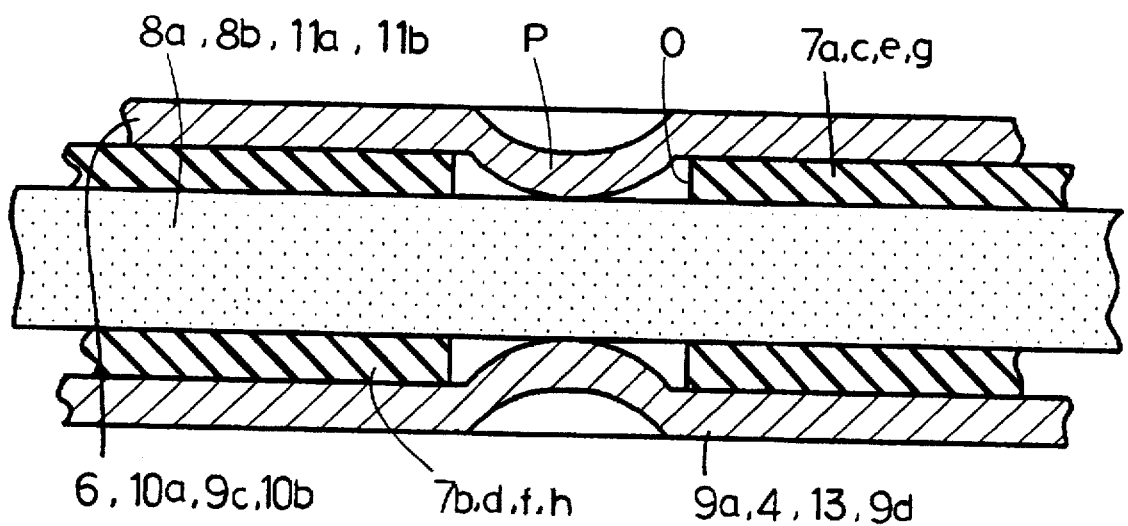
FIG. 6 is a schematic enlarged longitudinal section showing how each resonator is connected with a terminal plates opposite thereto.

As shown in FIGS. 3, 5 and 6, each of the earth terminal plate 4, the input and output terminal plates 6 and 13, the first, third and fourth junction terminal plates 9a, 9c and 9d, and auxiliary terminal plates 10a and 10b is provided with circular arc-shaped protuberant portion P at the center portion thereof. Each of the protuberant portions P is so positioned that a respective protuberant portion abuts on a vibrating node of the associated piezoelectric resonator when being assembled. Therefore, the protuberant portions P are used to electrically connect and mechanically support the piezoelectric resonators. Each of the annular conducting rubber plates 7a–7h is provided with an opening O at the center portion thereof. Each of the piezoelectric resonators 8a, 8b, 11a and 11b is electrically connected with the protuberant portions P of the associated terminal plates through the openings O of the annular conducting rubber plates positioned at both sides of the piezoelectric resonator when being assembled.

Figure 7:
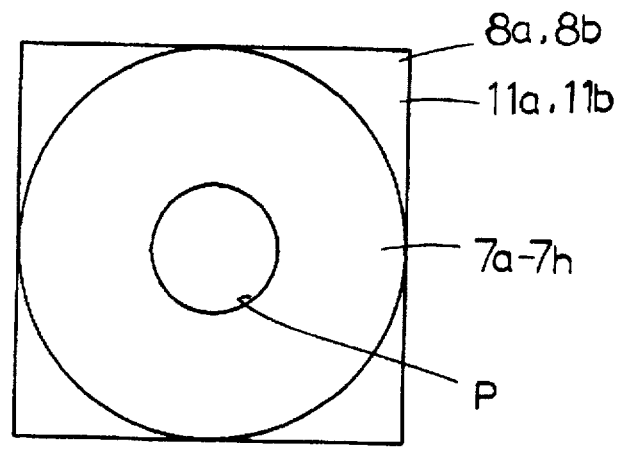
FIG. 7 is a schematic plan view showing the disposition of each rubber plate on each piezoelectric resonator.

Also, as shown in FIG. 7, because of the annular shape of each conducting rubber plate the corner edges of each resonator are maintained free from contact with the other components. Each resonator can be vibrated at a contour vibration mode without any suppression by the associated rubber plates, thereby reducing the insertion loss as compared with the prior art.

Figure 4:
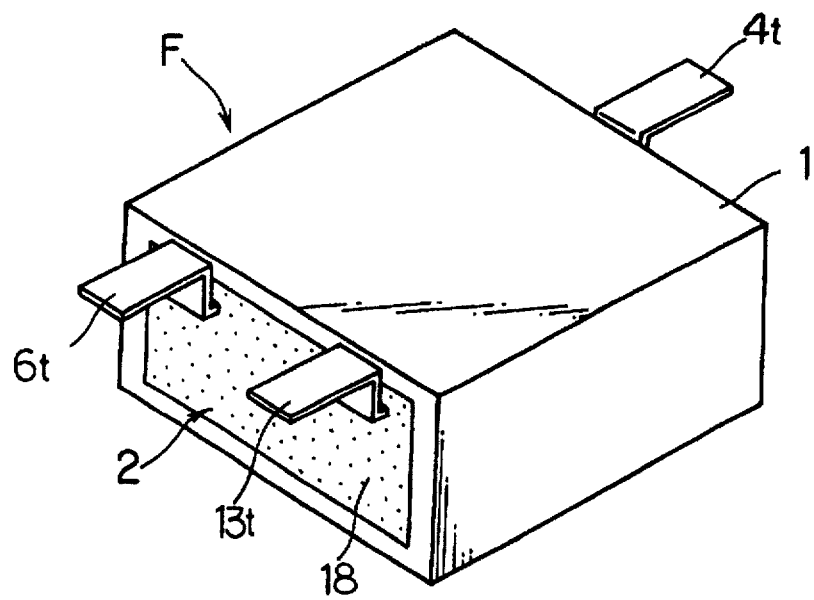
FIG. 4 is a perspective view showing the bottom portion of the electric filter device in which connecting legs are bent.

The connecting leg 6t of the input terminal plate 6 is bent as shown in FIG. 4 so that the end portion thereof is substantially positioned at the same level as that of the connecting leg 13t of the output terminal plate 13.

When the filter unit is assembled, one surface of the first thick piezoelectric resonator 8a is connected to the input terminal plate 6 via the protuberant portion P integrally provided thereon, and the other surface of the first thick piezoelectric resonator 8a is connected to the interconnected first and third junction terminal plates 9a and 9c via the protuberant portion P of the first junction terminal plate 9a. One surface of the second thin piezoelectric resonator 11a is connected to the interconnected first and third junction terminal plates 9a and 9c via the auxiliary terminal plate 10a, and the other surface of second thin piezoelectric resonator 11a is connected to the earth terminal plate 4 and to the interconnected second and fourth junction terminal plates 9b and 9d. One surface of the second thick piezoelectric resonator 8b is connected to the interconnected first and third junction terminal plates 9a and 9c, and the other surface of this resonator is directly connected to the the output terminal plate 13 to which one surface of the second thin piezoelectric resonator 11b is connected via the auxiliary terminal plate 10b, the other surface of this resonator being connected to the interconnected second and fourth junction terminal plates 9b and 9d.

In this way, the first and second thick piezoelectric resonators 8a and 8b are electrically in series connected between the input and output terminal plates 6 and 13 through the interconnected first and third junction terminal plates 9a and 9c. The first and second thin piezoelectric resonators 11a and 11b are in parallel connected between the input and output terminal plates 6 and 13 and are also connected to the earth terminal plate 4. Therefore, the first and second thick piezoelectric resonators 8a and 8b form a series branch of a filter circuit, and the first and second thin piezoelectric resonators 11a and 11b form a parallel branch of the filter circuit.

After the filter components 5 to 16 are inserted into the casing 1, as shown in FIG. 5, a cover plate 17 is fitted into the opening 2 of the casing 1 by passing the connecting legs 6t and 13t of the input and output terminal plates 6 and 13 through holes 17a and 17b provided on the cover plate 17 before a filler 18 such as epoxy resin is eventually applied into the opening 2. In this connection, in view of full sealing, the holes 17a and 17b should be designed to tightly fit to the respective connecting legs 6t and 13t.

In this way, a filter unit generally designated by F may be completed.

With the illustrated embodiment, instead of conducting rubber plates, insulating rubber plates may be used. In that case, the electrical connection between each resonator and the associated terminal plates may be performed by bringing protuberances of the terminal plates into contact with the resonator through an opening provided on each rubber plate. Alternately, conducting rubber discs each having no opening may be used and the electrical connection between each resonator and the associated terminal plates may be maintained via the associated conducting rubber disc.

Further, with the illustrated embodiment each rubber plate has circular peripheral shape. However, it is possible to use rubber plates each having polygonal shape such as octagon shape or other suitable shape.

In case rubber plates of circular shape are used, the orientation thereof does not need to be taken into consideration, and thus the mounting can be easily made without involving any discrepancy in peripheral direction, thereby obtaining a stable characteristic.

It will be further described in the following specific example how the characteristic of the filter device of the present invention can be improved.

There were prepared a filter arrangement using the above mentioned annular conducting rubber plates each having an outer diameter of 4.4 mm and an opening of 3 mm in inner diameter and another arrangement using rectangular conductive plates each having 4.4 mm width and length and an opening of 3 mm in inner diameter. The insertion loss in the former was 5.0 dB, as compared to 7.8 dB obtained with the latter, indicating that the use of the annular conducting rubber plates effected a substantial improvement in the insertion loss. It was therefore appreciated that it was possible not only to improve the group delay characteristic of the resonators but also to reduce the insertion loss.

In order to mount the thus constructed filter unit F on a printed circuit board 19, as shown in FIGS. 4 and 5, the input and output connecting legs 6t and 13t as well as the earth connecting leg 9t are cranked so that these terminals lie in the same level as the plane of the base surface of the casing 1. Since the outer extensions of connecting legs 6t and 13t lie in the same level, the outer extensions may be easily bent with the same die.

The filter unit F is disposed on the printed circuit board 19, and the cranked input and output connecting legs 7t and 13t and earth connecting leg 4t are connected with predetermined conductor portions provided on the surface of the board 19 by soldering generally designated by the reference numeral 20 as shown in FIG. 5. The filter unit F may be securely sustained at the front and rear sides on the surface of the board 19. In this connection, the outer end of each of the input and output connecting legs 6t and 13t and the earth connecting leg 4t may be inward bent, and in which case the casing 1 may be provided with rectangular recesses for containing the respective bent end portions of the connecting legs substantially at the same level as the plane of the base surface of the casing 1. Alternatively, the outer end of each connecting legs may also be folded.

Instead of soldering, the input, output and earth connecting legs may be respectively connected to the predetermined conductors on the board 19 by fitting them into through holes provided on the respective conductors.

Figure 8:
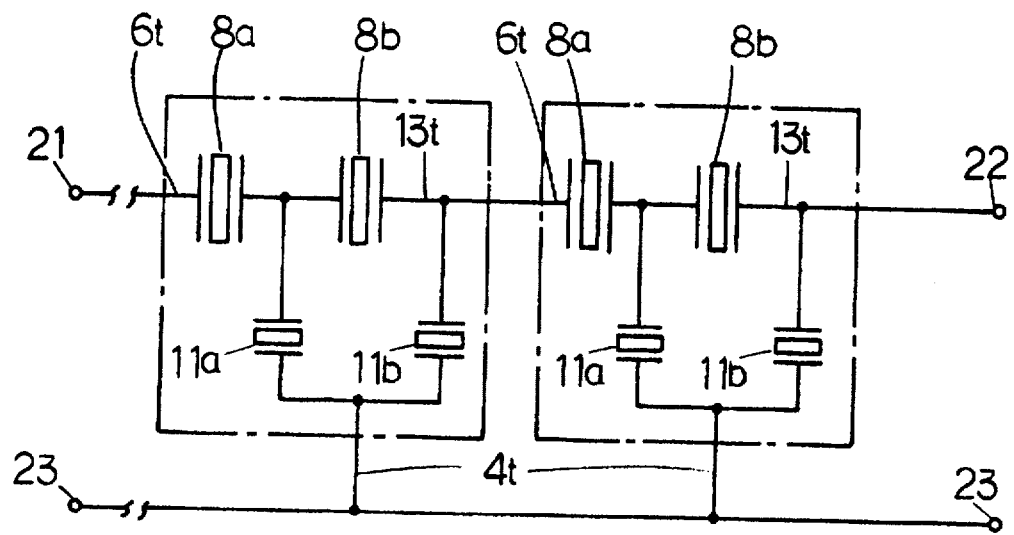
FIG. 8 is an equivalent circuit diagram of an electric filter device constructed by two four-element type filter units.

FIG. 8 shows an equivalent circuit diagram of the ladder-type electric filter device comprising two filter units as constructed in accordance with the illustrated embodiment.

As shown in FIG. 8, the first and second thick piezoelectric resonators 8a and 8b in each filter unit F are in series connected between input and output terminals 21 and 22 via the input and output connecting legs 6t and 13t. Across the second thick piezoelectric resonators 8b in each filter unit F are connected the first and second thin piezoelectric resonators 11a and 11b whose common terminal is connected through the earth connecting leg 4t to an earth terminal 23. Two filter units F are cascaded.

The above description has merely referred to an example of a filter device consisting of two essential filter units each of which comprises two series resonators connected in series and two parallel resonators. However, the preferred embodiment allows one or three resonator elements each for series and parallel branches to be assembled in the same casing.

Therefore, the present invention may be applied to any filter device in which any number of filter units are provided.

As described above, according to the present invention with the provision of the rubber plates on one or both sides of the respective piezoelectric resonators so that each rubber plate is brought into resilient contact with the surface of the associated piezoelectric resonator, each rubber plate having a contour with cut corners opposite to the corner edges of the associated piezoelectric resonator, a resonance resistance of each resonator can be increased and thus a mechanical quality factor Q can be substantially decreased, thereby improving group delay frequency characteristics.

Furthermore since each rubber plate is designed not to contact with the respective corner edges of the respective piezoelectric resonators which generate extensive contour vibrations, the contour vibrations are not suppressed and consequently the insertion loss can be reduced.

It is to be understood that the above-mentioned embodiments are only illustrative of the application of the principles of the present invention. Numerous modifications and alterations may be made by those skilled in the art without departing from the spirit and scope of the invention, and the appended claims are intended to cover such modifications and alterations.

We claim:

1. A ladder-type electric filter device comprising:

at least one piezoelectric resonator for a series branch and at least one piezoelectric resonator for a parallel branch, each of said piezoelectric resonators having corner edges and being operated in a contour vibration mode, a plurality of terminal plates each having a connecting leg for electrically connecting said piezoelectric resonators to form a predetermined connection type filter circuit and mechanically supporting said piezoelectric resonators, a casing for containing said piezoelectric resonators and said terminal plates, and a conducting rubber plate interposed between at least one surface of each said piezoelectric resonator and the adjacent said terminal plate, each of said rubber plates having a contour with cut corners opposite to the corner edges of the associated said piezoelectric resonator for preventing a contour vibration mode of said piezoelectric resonators from being suppressed, each said rubber plate being brought into resilient face-to-face contact with the associated said piezoelectric resonator, and each said rubber plate connecting the associated said piezoelectric resonator with the associated said terminal plate.

2. A ladder-type electric filter device as claimed in claim 1, wherein each of said rubber plates is circular shaped.

3. A ladder-type electric filter device as claimed in claim 1, wherein each of said resonators and the associated terminal plate are electrically connected to each other by bringing a protuberance provided on the terminal plate into contact with an electrode of the resonator through an opening formed on said interposed rubber plate.

4. A ladder-type electric filter device as claimed in claim 1, wherein each of said resonators and the associated terminal plate are electrically connected to each other by said conducting rubber plate.

5. A ladder-type electric filter device as claimed in claim 1, wherein each of said rubber plates is polygonal shaped.

6. A ladder-type electric filter device as claimed in claim 5, wherein each of said rubber plates is an octagon.

7. A ladder-type electric filter device comprising:

at least one piezoelectric resonator for a series branch and at least one piezoelectric resonator for a parallel branch, each of said piezoelectric resonators having corner edges and being operated in a contour vibration mode, a plurality of terminal plates each having a connecting leg for electrically connecting said piezoelectric resonators to form a predetermined connected type filter circuit and mechanically supporting said piezoelectric resonators, each terminal plate being provided with a protuberance at the center portion thereof, a casing for containing said piezoelectric resonators and said terminal plates, and a rubber plate interposed between at least one surface of each said piezoelectric resonator and the adjacent said terminal plate, each of said rubber plates having a contour with cut corners opposite to the corner edges of the associated said piezoelectric resonator for preventing a contour vibration mode of said piezoelectric resonators from being suppressed and a center opening through which said protuberance of the associated said terminal plate protrudes to electrically connect and mechanically support said piezoelectric resonators, each said rubber plate being brought into resilient face-to-face contact with the associated said piezoelectric resonator.

* * * * *